United States Patent
Erbert et al.

(10) Patent No.: US 12,218,487 B2
(45) Date of Patent: Feb. 4, 2025

(54) DEVICE FOR GENERATING LASER RADIATION

(71) Applicant: FERDINAND-BRAUN-INSTITUT GGMBH, LEIBNIZ-INSTITUT FÜR HÖCHSTFREQUENZTECHNIK, Berlin (DE)

(72) Inventors: Goetz Erbert, Lobau (DE); Hans Wenzel, Berlin (DE); Steffen Knigge, Konigs Wusterhausen (DE); Christian Dominik Martin, Berlin (DE); Andre Maassdorf, Berlin (DE); Pietro Della Casa, Berlin (DE); Andrea Knigge, Konigs Wusterhausen (DE); Paul Crump, Berlin (DE)

(73) Assignee: FERDINAND-BRAUN-INSTITUT GGMBH, LEIBNIZ-INSTITUT FÜR HÖCHSTFREQUENZTECHNIK, Berlin (DE)

( * ) Notice: Subject to any disclaimer, the term of this patent is extended or adjusted under 35 U.S.C. 154(b) by 725 days.

(21) Appl. No.: 17/426,846

(22) PCT Filed: Jan. 9, 2020

(86) PCT No.: PCT/EP2020/050462
§ 371 (c)(1),
(2) Date: Jul. 29, 2021

(87) PCT Pub. No.: WO2020/156775
PCT Pub. Date: Aug. 6, 2020

(65) Prior Publication Data
US 2022/0115835 A1    Apr. 14, 2022

(30) Foreign Application Priority Data
Jan. 31, 2019 (DE) .......................... 102019102499.4

(51) Int. Cl.
    H01S 5/22    (2006.01)
    H01S 5/10    (2021.01)
    H01S 5/40    (2006.01)

(52) U.S. Cl.
    CPC .......... *H01S 5/2205* (2013.01); *H01S 5/1064* (2013.01); *H01S 5/2206* (2013.01); *H01S 5/4043* (2013.01)

(58) Field of Classification Search
    CPC ............................ H01S 5/1064; H01S 5/2231
    See application file for complete search history.

(56) References Cited

U.S. PATENT DOCUMENTS

| 4,149,175 A * | 4/1979 | Inoue | H01S 5/2232 |
| | | | 257/E33.005 |
| 4,183,038 A * | 1/1980 | Namizaki | H01L 33/0025 |
| | | | 438/45 |

(Continued)

FOREIGN PATENT DOCUMENTS

| DE | 102008014093 A1 | 7/2009 |
| DE | 102008022941 A1 | 9/2009 |

(Continued)

OTHER PUBLICATIONS

European Search Report dated Jan. 23, 2024, issued in European Application No. 2070872.3.

(Continued)

*Primary Examiner* — Joshua King
(74) *Attorney, Agent, or Firm* — Workman Nydegger

(57) ABSTRACT

The present invention relates to a device for generating laser radiation.
An object of the present invention is to indicate a laser diode which simultaneously has a high degree of efficiency and a low degree of far field divergence.
The diode laser according to the invention comprises a current barrier (5), characterized in that the current barrier (Continued)

(5) extends along a third axis (X), wherein the current barrier (5) has at least one opening, and a first width (W1) of the opening of the current barrier (5) along the third axis (X) is smaller than a second width (W2) of the metal p-contact (8) along the third axis (X).

19 Claims, 9 Drawing Sheets

(56) References Cited

U.S. PATENT DOCUMENTS

| | | | | | |
|---|---|---|---|---|---|
| 4,359,776 | A | * | 11/1982 | Acket | H01S 5/20 359/344 |
| 4,514,896 | A | * | 5/1985 | Dixon | H01S 5/2202 438/501 |
| 4,871,690 | A | * | 10/1989 | Holonyak, Jr. | B82Y 20/00 257/190 |
| 4,896,331 | A | * | 1/1990 | Hirata | H01S 5/12 372/102 |
| 5,136,601 | A | * | 8/1992 | Kajimura | H01S 5/10 372/45.01 |
| 5,297,158 | A | * | 3/1994 | Naitou | H01S 5/12 372/45.01 |
| 5,359,619 | A | | 10/1994 | Yoshida et al. | |
| 5,523,256 | A | * | 6/1996 | Adachi | H01S 5/2231 438/31 |
| 5,822,347 | A | * | 10/1998 | Yokogawa | H01S 5/18341 372/45.01 |
| 5,974,069 | A | * | 10/1999 | Tanaka | H01S 5/32325 372/45.01 |
| 6,148,014 | A | * | 11/2000 | Geels | H01S 5/04254 372/46.01 |
| 6,154,476 | A | * | 11/2000 | Nishiguchi | H01S 5/32 372/45.01 |
| 6,359,919 | B1 | * | 3/2002 | Ishikawa | H01S 5/34333 372/45.01 |
| 6,590,919 | B1 | * | 7/2003 | Ueta | H01S 5/32341 372/46.01 |
| 9,240,675 | B2 | * | 1/2016 | Hashimoto | H01S 5/34313 |
| 10,008,828 | B1 | | 6/2018 | Doussiere | H01S 5/04254 |
| 10,547,159 | B1 | * | 1/2020 | Holly | H01S 5/0424 |
| 2001/0017870 | A1 | * | 8/2001 | Hayakawa | H01S 5/02461 372/40 |
| 2001/0043631 | A1 | | 11/2001 | Kitamura et al. | |
| 2003/0021318 | A1 | | 1/2003 | Liao et al. | |
| 2003/0132454 | A1 | * | 7/2003 | Lell | H01S 5/2232 257/200 |
| 2005/0121682 | A1 | * | 6/2005 | Shigihara | H01S 5/20 438/47 |
| 2007/0217458 | A1 | * | 9/2007 | Kitano | H01S 5/2231 372/43.01 |
| 2008/0037607 | A1 | * | 2/2008 | Hashimoto | H01S 5/2231 372/45.01 |
| 2008/0063020 | A1 | * | 3/2008 | Fukuda | H01S 5/32341 372/45.012 |
| 2008/0112450 | A1 | | 5/2008 | Krakowski | |
| 2008/0151952 | A1 | * | 6/2008 | Takatani | H01S 5/2231 257/E31.118 |
| 2008/0247433 | A1 | * | 10/2008 | Tsuchiya | B82Y 20/00 257/E33.011 |
| 2008/0303017 | A1 | | 12/2008 | Ohya | |
| 2009/0196317 | A1 | * | 8/2009 | Suzuki | H01S 5/18308 372/44.01 |
| 2009/0244515 | A1 | | 10/2009 | Behringer et al. | |
| 2009/0323750 | A1 | * | 12/2009 | Inoue | B82Y 20/00 438/22 |
| 2010/0265976 | A1 | * | 10/2010 | Bousquet | H01L 21/0254 257/E33.028 |
| 2011/0128985 | A1 | | 6/2011 | Noma et al. | |
| 2011/0128986 | A1 | * | 6/2011 | Shigihara | H01S 5/2231 372/46.01 |
| 2017/0063046 | A1 | * | 3/2017 | Fukagai | H01S 5/1014 |
| 2017/0236974 | A1 | * | 8/2017 | Malinverni | H01S 5/3013 372/46.01 |
| 2018/0019571 | A1 | * | 1/2018 | Fricke | H01S 5/0421 |
| 2018/0337513 | A1 | * | 11/2018 | Crawford | H01S 5/2086 |
| 2020/0161836 | A1 | | 5/2020 | Sven et al. | |

FOREIGN PATENT DOCUMENTS

| | | | | |
|---|---|---|---|---|
| DE | 10 2017 113 389 A1 | | 12/2018 | |
| EP | 0231075 A2 | * | 1/1987 | |
| JP | 56112790 A | | 9/1981 | |
| JP | 60163486 A | * | 8/1985 | H01S 5/10 |
| JP | 6187384 A | | 5/1986 | |
| JP | 63222488 A | | 9/1988 | |
| JP | S63222488 A | | 9/1988 | |
| JP | 03297187 A | | 12/1991 | |
| JP | 05167175 A | | 7/1993 | |
| JP | H11-26867 A | | 1/1999 | |
| JP | 2004327705 A | * | 11/2004 | B82Y 20/00 |
| JP | 2005158760 A | | 6/2005 | |
| JP | 2008047672 A | * | 2/2008 | B82Y 20/00 |
| JP | 2008053539 A | * | 3/2008 | B82Y 20/00 |
| JP | 4079393 B2 | * | 4/2008 | H01S 5/32341 |
| JP | 2009210577 A | | 9/2009 | |
| JP | 2010-80974 A | | 4/2010 | |
| JP | 2011114214 A | | 6/2011 | |
| JP | 50-28640 A | | 9/2012 | |
| KR | 20060124310 A | * | 5/2005 | |

OTHER PUBLICATIONS

Office Action from corresponding Japanese application 2021-544779, Jan. 11, 2023.
H. Wenzel et al. "High-power diode lasers with small vertical beam divergence emitting at 808 nm", Electronics Letters vol. 37 (2001)], Photonic Band Crystal.
M.V. Maximum et al. "Longitudinal photonic bandgap crystal laser diodes with ultranarrow vertical beam divergence", Proc. SPIE vol. 6115 (2006).
Korean Office Action dated Aug. 23, 2023, issued in Korean Application No. 10-2021-7024384.
German Office Action issued in DE 10 2019 102 449.4, dated Apr. 5, 2024.

* cited by examiner

DEVICE FOR GENERATING LASER RADIATION

PRIOR ART

In general, edge-emitting laser diodes (diode lasers) have an active layer which is embedded in semiconductor layers, which differ from one another due to their bandgaps, refractive indexes and doping. The layers below and above the active layer differ in particular due to the conduction type (n or p). In addition to guaranteeing the transport of electrons and holes to the active layer, where they recombine in a stimulated manner and generate laser radiation, these layers serve to guide the laser light vertically. The layers adjacent to the active layer are designated waveguide layers, while the layers adjacent to the waveguide layers are designated cladding layers. Typically, the refractive index of the active layer is greater than that of the waveguide layers and the refractive index of the waveguide layers is greater than that of the cladding layers [E. Kapon (Ed.): "Semiconductor Lasers I: Fundamentals", Academic Press 1998]. However, other configurations are also possible (e.g., Vertical ARROW (H. Wenzel et al: "High-power diode lasers with small vertical beam divergence emitting at 808 nm", Electronics Letters vol. 37 (2001)], Photonic Band Crystal [M. V. Maximum et al: "Longitudinal photonic bandgap crystal laser diodes with ultra-narrow vertical beam divergence", Proc. SPIE vol. 6115 (2006)]).

The epitaxially grown semiconductor layer structure of an edge-emitting diode laser is electrically contacted by a large-area metal n-contact and a defined metal p-contact. An electrical voltage is applied between both contacts in such a way that an electric current flows between both contacts, by means of which holes and electrons are injected into the active layer. The width of the n-contact is frequently identical to the width of the laser chip. The dimensions of the p-contact are selected in accordance with the desired emission aperture. Due to the lateral widening of the current path between the p-contact and the active layer, the electrically pumped surface is constantly wider than the p-contact. The so-called current path widening occurs, first and foremost, in the heavily doped contact layer, but also in the underlying p-doped layers.

DE102008014093A1 discloses a laser diode which is suitable for generating laser radiation having reduced beam divergence.

However, it is disadvantageous that the electrical resistance is high and the thermal conductivity is low due to the narrow p-contact. In addition, crystal defects can be created by mechanical tensions exerted from the outside due to the relatively narrow p-contact layer.

DISCLOSURE OF THE INVENTION

It is therefore an object of the present invention to realize a low electrical resistance of the p-contact despite the low beam divergence.

These and other objects are achieved according to the invention by the features of claim 1 (device) and claim 13 (method). Expedient configurations of the invention are included in the subclaims.

A diode laser according to the invention comprises first n-type functional layers, a metal n-contact, an active layer which is suitable for generating electromagnetic radiation and which is arranged on the first functional layers, second p-type functional layers which are arranged on the active layer, wherein the second functional layers comprise first p-type layers and second p-type layers, a metal p-contact, a current barrier which is arranged between the first p-type layers and the second p-type layers, at least one facet for coupling out electromagnetic radiation along a first axis, wherein the first functional layers, the active layer and the second functional layers are stacked along a second axis, wherein the current barrier extends along a third axis, wherein the current barrier has at least one opening, and a first width of the opening along the third axis is smaller than a second width of the metal p-contact along the third axis.

The idea of the present invention is to introduce a current barrier into a diode laser in such a way that the size of the contact surface of the metal p-contact and the thickness of the second p-type layers lying under the metal p-contact can be increased. The advantage of this is that the electrical resistance can be significantly reduced by the large p-contact surface without negatively influencing the beam properties, and thicker second p-type layers allow mechanical tensions to be relieved more easily, which has a positive effect on the service life and beam quality of the laser.

The current barrier is preferably only introduced into partial regions of the first p-type layers.

The first n-type functional layers preferably comprise a n-cladding layer, a n-waveguide layer and a n-contact layer, even more preferably the first n-type functional layers consist of precisely one n-cladding layer, one n-waveguide layer and one n-contact layer.

The first p-type layers preferably comprise a p-waveguide layer and a p-cladding layer, even more preferably the first p-type layers consist of precisely one p-waveguide layer and one p-cladding layer.

The second p-type layers preferably comprise a p-contact layer, even more preferably the second p-type layers consist of precisely one p-contact layer.

A thickness of the first p-type layers is preferably smaller than a thickness of the second p-type layers. This is advantageous, because mechanical tensions of the semiconductor layers can be relieved as a result.

In a preferred embodiment, a projection of the opening of the current barrier along the second axis overlaps completely with the metal p-contact. The advantage of this is that a current expansion is reduced and, as a result, the laser becomes more efficient.

According to a further embodiment of the invention, the current barrier has a plurality of openings, wherein a projection of the openings along the second axis completely overlaps with the metal p-contact. This is advantageous, because a shaping of the optical laser beam field and, consequently, an improvement in the beam quality can be achieved by modulating the current density and, consequently, the injected charge carriers in the active layer.

All of the openings in the current barrier are preferably equally wide. This prevents disparities in the current density in the active layer, resulting in additional advantages for the beam quality.

A uniform distribution of the openings of the current barrier along the lateral (third) axis is further preferred. This guarantees that the active zone is utilized as completely as possible.

In further embodiments according to the invention, at least two active layers are preferably provided, which are formed at a distance from one another along the second axis, and wherein at least two current barriers are provided (that is to say, at least two current barriers at a distance from one another along the second axis for at least two active layers). This makes it possible to combine a diode laser for two frequencies or with double the output power at the same electric current with the advantages of the current barriers. In this case, two emitters are stacked.

In a further embodiment according to the invention, at least two active layers are preferably provided, which are formed at a distance from one another along the second axis, wherein only one current barrier is provided. The advantage of this embodiment is the simpler production, since only one current barrier has to be formed.

According to a further embodiment according to the invention, at least two current barriers are provided, which are at a distance from one another along the first axis. As a result, the active zone is further utilized as completely as possible and the beam properties of the laser are improved.

In an embodiment according to the invention, the width of the opening of the current barrier varies along the first axis. Here, the laser beam properties can be varied via the first axis.

According to a further embodiment, current barriers are provided along the first axis in the region of the facets.

The difference between the second width of the metal p-contact and the first width of the opening of the current barrier is preferably greater than 1 µm, even more preferably greater than 5 µm, even more preferably greater than 20 µm and even more preferably greater than 50 µm. As the difference between the second width of the metal p-contact and the first width of the opening of the current barrier increases, a lower electrical resistance is achieved due to the wider metal p-contact and the heat dissipation becomes more efficient, wherein a current expansion is simultaneously prevented.

The first width of the opening of the current barrier is preferably greater than 0.5 µm, more preferably greater than 2 µm, more preferably greater than 5 µm, more preferably greater than 10 µm, more preferably greater than 30 µm, more preferably greater than 50 µm, more preferably greater than 100 µm, more preferably greater than 200 µm and even more preferably greater than 400 µm. The current is conducted more efficiently through the barrier thanks to a larger opening in the current barrier, but without accepting a current expansion.

The thickness of the current barrier is preferably greater than 0.10 µm, more preferably greater than 0.15 µm, even more preferably greater than 0.20 µm, even more preferably greater than 0.25 µm, even more preferably greater than 0.30 µm, even more preferably greater than 0.40 µm, even more preferably greater than 0.50 µm and even more preferably greater than 1.00 µm. The electrical conductivity becomes more resistant due to a thicker current barrier.

The distance of the current barrier from the active layer is preferably smaller than 1 µm, more preferably smaller than 0.5 µm, more preferably smaller than 0.2 µm, more preferably smaller than 0.1 µm and even more preferably smaller than 0.01 µm. The current expansion can be better prevented by a smaller distance of the current barrier from the active layer.

The thickness of the first p-type layers is preferably smaller than 5 µm, more preferably smaller than 2 µm, more preferably smaller than 1 µm, more preferably smaller than 0.5 µm, more preferably smaller than 0.2 µm and even more preferably smaller than 0.1 µm. The introduction of the current barrier can be facilitated by smaller layer thicknesses of the first p-type layers.

The thickness of the second p-type layers is preferably greater than 0.05 µm, more preferably greater than 0.1 µm, more preferably greater than 0.5 µm, more preferably greater than 1 µm and even more preferably greater than 5 µm. Mechanical stresses which lead to crystal defects can be better relieved due to larger layer thicknesses of the second p-type layers.

A quotient of the thickness of the second p-type layer to the thickness of the first p-type layer is preferably greater than 0.1, more preferably greater than 0.2, more preferably greater than 1, more preferably greater than 2 and even more preferably greater than 10. This results in the advantage that the current expansion is minimized after the current crosses the current barrier.

The diode laser is preferably configured as an edge-emitting diode laser. The diode laser is preferably configured as an optical amplifier. This results in the advantage that the laser diode can be constructed as easily as possible.

A carrier substrate (for example GaAs, InP, GaSb or GaN) is preferably provided, on which the indicated layer structure is constructed.

The first n-type functional layers are preferably arranged on the side of the active layer which faces the carrier substrate, whereas the second p-type functional layers are arranged on the side of the active layer which faces away from the carrier substrate.

The metal n-contact is preferably arranged on the side of the carrier substrate which faces away from the first n-type functional layers.

The current barrier preferably has a specific electrical resistance which is significantly greater than the specific electrical resistance (hereinafter referred to as $\sigma_c$) for example $\sigma_c = 5.5 \times 10^{-5}$ $\Omega$-cm$^2$) of the layer structure used. The specific electrical resistance of the resistance elements is preferably more than 2 $\sigma_c$ (for example $1.1 \times 10^{-4}$ $\Omega$-cm$^2$), further preferably more than 10 $\sigma_c$ (for example $5.5 \times 10^{-4}$ $\Omega$-cm$^2$), further preferably more than $10^2$ $\sigma_c$ (for example $5.5 \times 10^{-3}$ $\Omega$-cm$^2$), further preferably more than $10^3$ $\sigma_c$ (for example $5.5 \times 10^{-2}$ $\Omega$-cm$^2$), further preferably more than $10^4$ $\sigma_c$ (for example $5.5 \times 10^{-1}$ $\Omega$-cm$^2$), further preferably more than $10^5$ $\sigma_c$ (for example 5.5 $\Omega$-cm$^2$), further preferably more than $10^6$ $\sigma_c$ (for example $5.5 \times 10^1$ $\Omega$-cm$^2$), further preferably more than $10^7$ $\sigma_c$ (for example $5.5 \times 10^2$ $\Omega$-cm$^2$), further preferably more than $10^8$ $\sigma_c$ (for example $5.5 \times 10^3$ $\Omega$-cm$^2$) and, particularly preferably, more than $10^9$ $\sigma_c$ (for example $5.5 \times 10^4$ $\Omega$-cm$^2$).

In a further preferred configuration, a ratio of the specific resistances of the current barrier in relation to the specific resistance of the layer structure used is greater than 2, further preferably greater than 10, further preferably greater than $10^2$, further preferably greater than $10^3$, further preferably greater than $10^4$, further preferably greater than $10^5$, further preferably greater than $10^6$, further preferably greater than $10^7$, further preferably greater than $10^8$ and, particularly preferably, greater than $10^9$.

The first p-type layers and the second p-type layers preferably consist of different materials.

Further preferably, the current barrier and the first p-type layers consist of the same base material, wherein the current barrier is formed by introducing impurity atoms (also referred to as foreign atoms) into the first p-type layers.

A further aspect of the present invention relates to a method for producing a laser diode.

The indicated method for producing a laser diode comprises the following method steps: configuring first n-type functional layers, configuring an active layer which is suitable for generating electromagnetic radiation and which is arranged on the first functional layers, configuring first p-type layers on the active layer, introducing foreign atoms into the first p-type layers in order to configure a current barrier, subsequently configuring second p-type layers on the first p-type layers, configuring a metal n-contact under the first n-type functional layers and configuring a metal p-contact on the second p-type layers, wherein the foreign atoms are merely introduced into partial regions of the first p-type layers, wherein a width of a partial region of the first p-type layers, in which no foreign atoms are introduced, is smaller than a width of the metal p-contact.

In a preferred embodiment, the foreign atoms are introduced by means of a structured mask, the mask is more preferably formed on the first p-type layers prior to the introduction of the foreign atoms and is removed again following the introduction of the foreign atoms into the first p-type layers. This makes it easy to introduce foreign atoms into the first p-type layers by, for example, implantation or diffusion.

Silicon, oxygen, iron or selenium are preferably introduced into the first p-type layers as foreign atoms in order to configure the current barrier. This produces a long-term stable and resistant current barrier.

The first n-type functional layers, the active layer, the first p-type layers and the second p-type layers are preferably formed by means of epitaxial processes.

In the method, the thickness of the first p-type layers is preferably formed to be smaller than the thickness of the second p-type layers.

In the method, the thickness of the current barrier is preferably formed to be greater than 0.10 µm, more preferably greater than 0.15 µm, even more preferably greater than 0.20 µm, even more preferably greater than 0.25 µm, even more preferably greater than 0.30 µm, even more preferably greater than 0.40 µm, even more preferably greater than 0.50 µm and even more preferably greater than 1.00 µm. The electrical conductivity becomes more resilient due to a thicker current barrier.

A wider metal p-contact lowers the electrical resistance, resulting in more efficient operation of the laser. The heat dissipation during a p-bottom mounting of the laser is additionally improved by a larger contact surface. Thicker second p-type layers enlarge the distance from the metal p-contact to the active layer and thus allow greater tolerances for facet coating and the p-bottom mounting. Mechanical tensions, which are introduced by the mounting in the semiconductor layers, are better relieved via thick second p-type layers, as a result of which fewer crystal defects are generated in the proximity of the active layer, which improves the service life. Thicker second p-type layers also have a positive effect on the degree of polarization and the form of the thermal lens and, consequently, on the beam quality.

The various embodiments and aspects of the invention indicated in this application can, unless otherwise stated in the individual case, be advantageously combined with one another. In particular, representations and descriptions regarding preferred configurations and embodiments of the method can constantly be transferred to the device accordingly, and vice versa.

BRIEF DESCRIPTION OF THE DRAWINGS

The invention is explained below in exemplary embodiments with reference to the associated drawing, wherein.

DETAILED DESCRIPTION OF THE DRAWINGS

Figure 1:
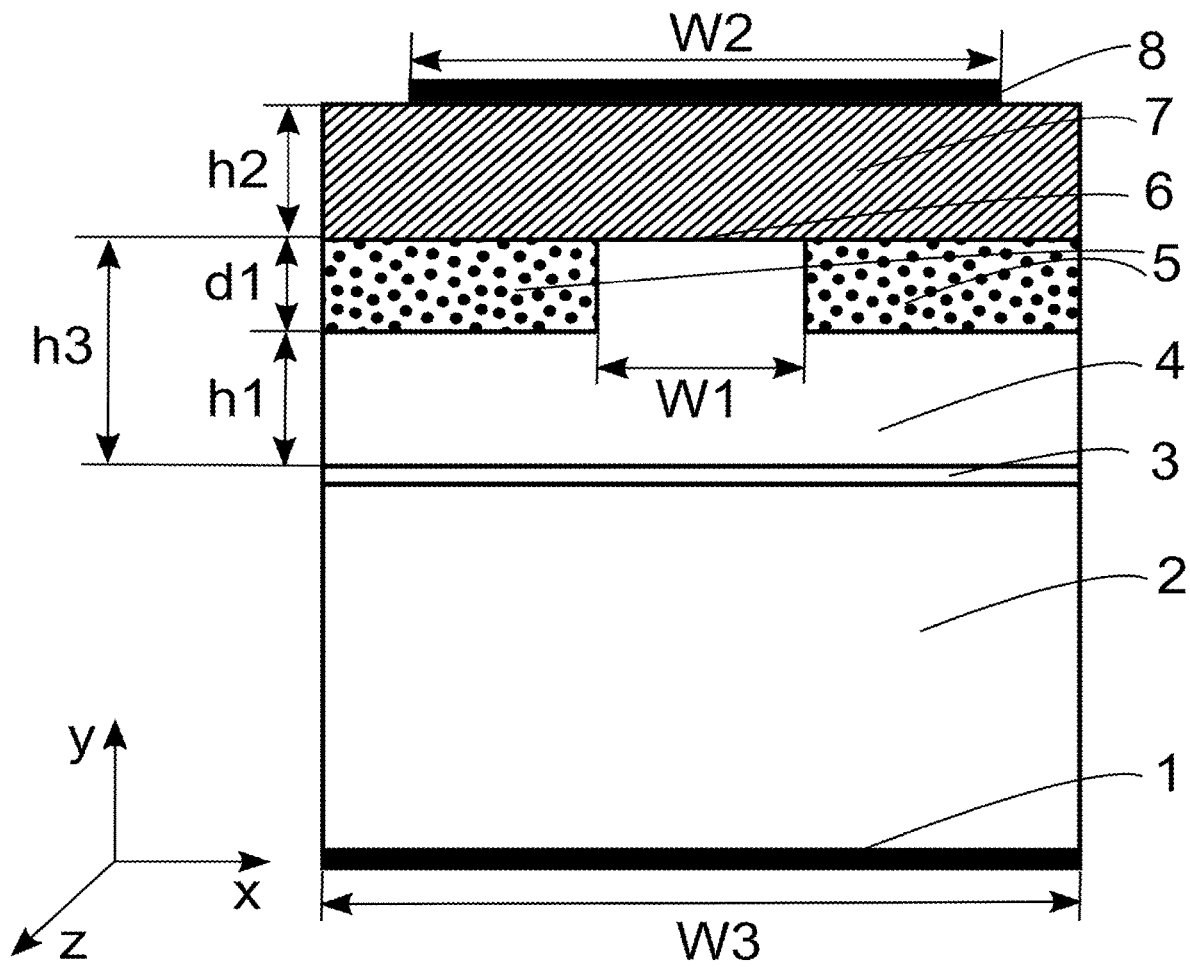
FIG. 1 shows a laser diode according to the invention in a schematic sectional representation.

FIG. 1 shows a first embodiment of a laser diode according to the invention in a schematic sectional representation. The laser diode has a layer construction having a metal n-contact 1, first n-type functional layers 2 arranged thereon (including n-type carrier substrate), an active layer 3 arranged thereon, first p-type layers 4 arranged thereon, a current barrier 5, second p-type layers 7 arranged thereon and a metal p-contact 8 arranged thereon, wherein a boundary surface 6 is introduced (or formed) between the first p-type layers 4 and the second p-type layers 7. In the embodiment in FIG. 1, the current barrier 5 is formed as a part of the first p-type layers 4 implanted with foreign atoms, wherein the non-implanted part of the first p-type layers 4 is formed with a first thickness h1, the current barrier 5 is formed with a thickness d1 and the second p-type layers 7 are formed with a second thickness h2. The current barrier 5 is formed with an opening having the first width W1 and the metal p-contact is formed with a second width W2. The width of the metal n-contact is formed to correspond to the third width W3 of the laser diode chip. In this embodiment, the current barrier 5 with its opening is utilized to restrict the current path. The current flows from the metal p-contact 8 through the opening of the current barrier 5 in the direction of the active layer 3. The current barrier 5 counteracts the expansion of the current. This guarantees that a wide p-contact 8 can be utilized. Since the current expansion is counteracted, the second p-type layers 7 can also be expanded in their layer thickness without having negative effects on the current expansion.

In the preferred exemplary embodiment for generating laser radiation having a wavelength of 920 nm, the active layer 3 is, e.g., preferably formed from $In_yGa_{1-y}As$ with a thickness of 7 nm and a molar In proportion y of 10%. The first n-type functional layers 2, first p-type layers 4, current barrier 5 and second p-type layers 7 are produced from $Al_xGa_{1-x}As$. The first n-type functional layers 2 preferably consist of a n-cladding layer having a molar Al proportion x in $Al_xGa_{1-x}As$ of 35% and a layer thickness of 1.5 µm, a n-waveguide layer with a layer thickness of 2.5 µm, in which the molar Al proportion of 35% at the boundary with the n-cladding layer drops to 20% at the lower boundary with the active layer 3. The first p-type layers 4 having a layer thickness h3 consist of a p-type waveguide layer having a layer thickness of 0.25 µm, in which the molar Al proportion of 20% at the boundary with the active layer 3 increases to 70%, and an adjoining p-cladding layer having a layer thickness of 0.6 µm and a molar Al proportion of 70%. The molar Al proportion in the second p-type layers 7 having a thickness h2 of 1 µm is 0%.

Figure 2:
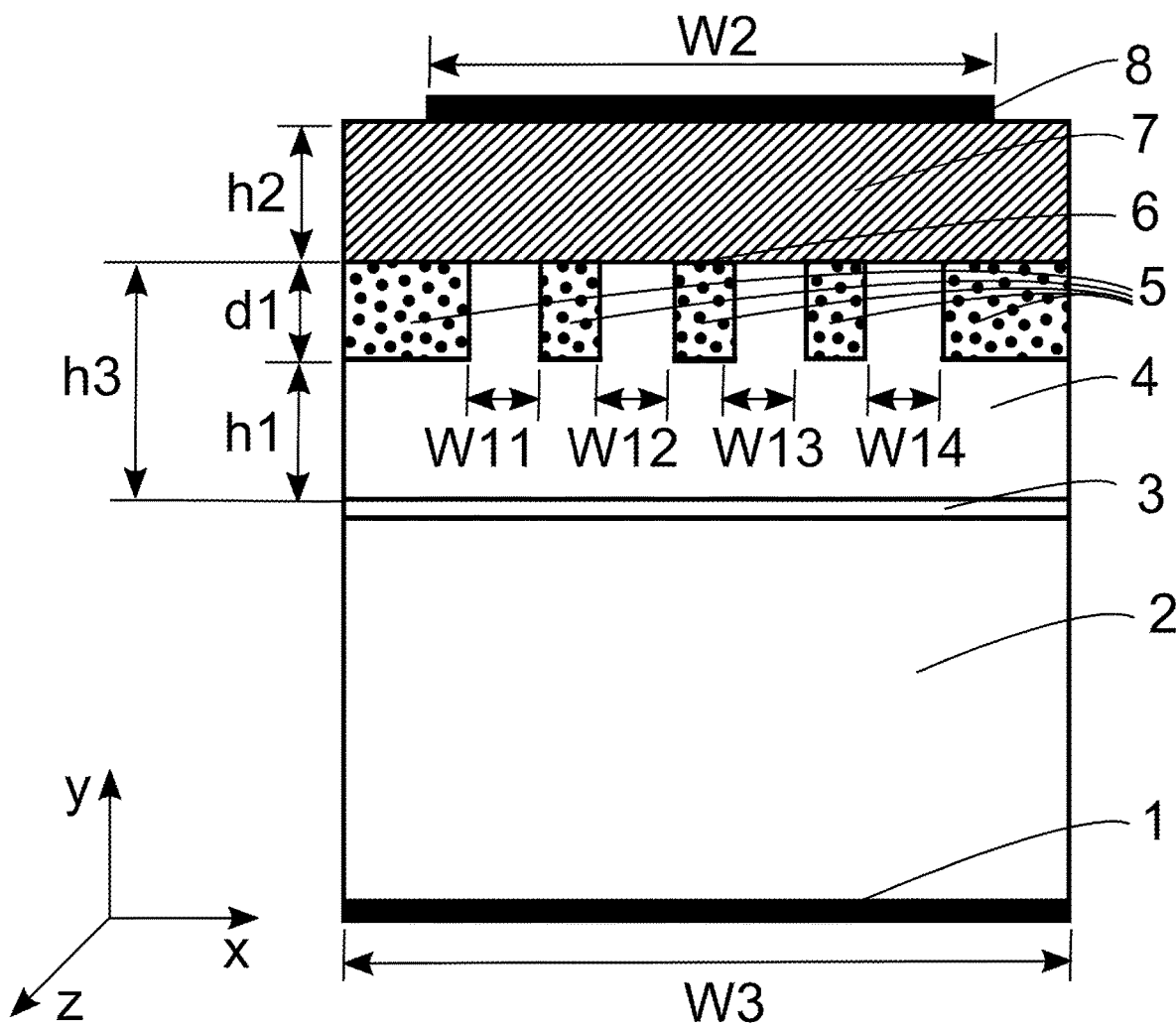
FIG. 2 shows a further laser diode according to the invention in a schematic sectional representation.

FIG. 2 shows a further embodiment of a laser diode according to the invention in a schematic sectional representation. In this embodiment, the current barrier 5 is formed, by way of example, with four openings having widths W11, W12, W13 and W14. This achieves a modulation of the current density and, consequently, of the injected charge carriers in the active layer along the third axis X, as a result of which the optical laser beam field is shaped and an improvement in the beam quality can be achieved. In a preferred embodiment, the widths W11, W12, W13 and W14 of the openings of the current shield are the same size, as a result of which a particularly homogeneous power distribution along the second axis Y is achieved.

Figure 3A:
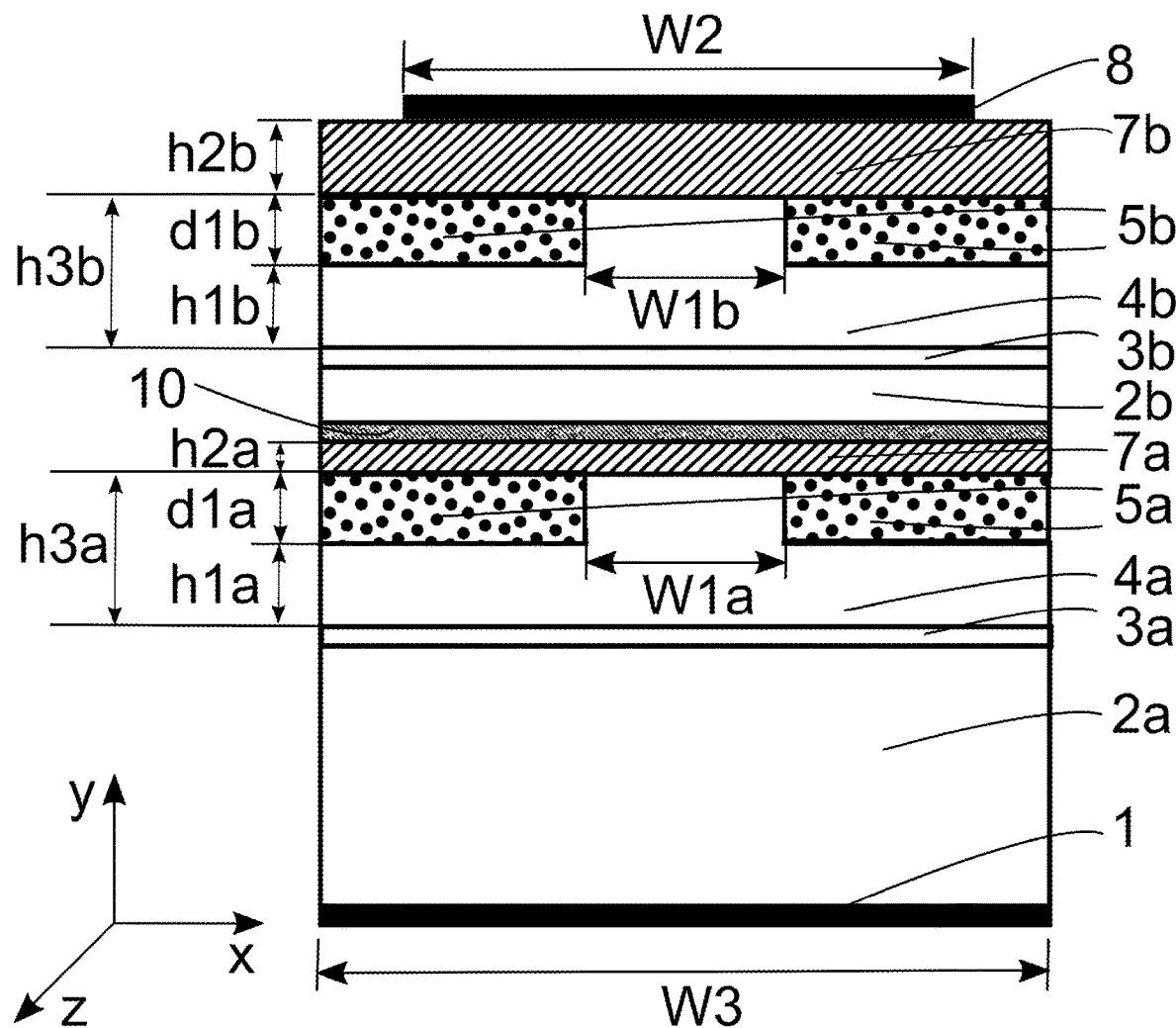
FIG. 3A shows yet another laser diode according to the invention in a schematic sectional representation.

FIG. 3A shows a further embodiment of a laser diode according to the invention in a schematic sectional representation. In this embodiment, the laser diode is formed along the second axis Y with two stacked emitters a, b, wherein a current barrier 5a, 5b is formed for each emitter. The two emitters are preferably separated from one another by a tunnel diode 10. In this embodiment, double as much light output can be generated with the same current by the contacts 1, 8, with constant utilization of current barriers 5a, 5b in order to counteract the expansion of the current.

Figure 3B:
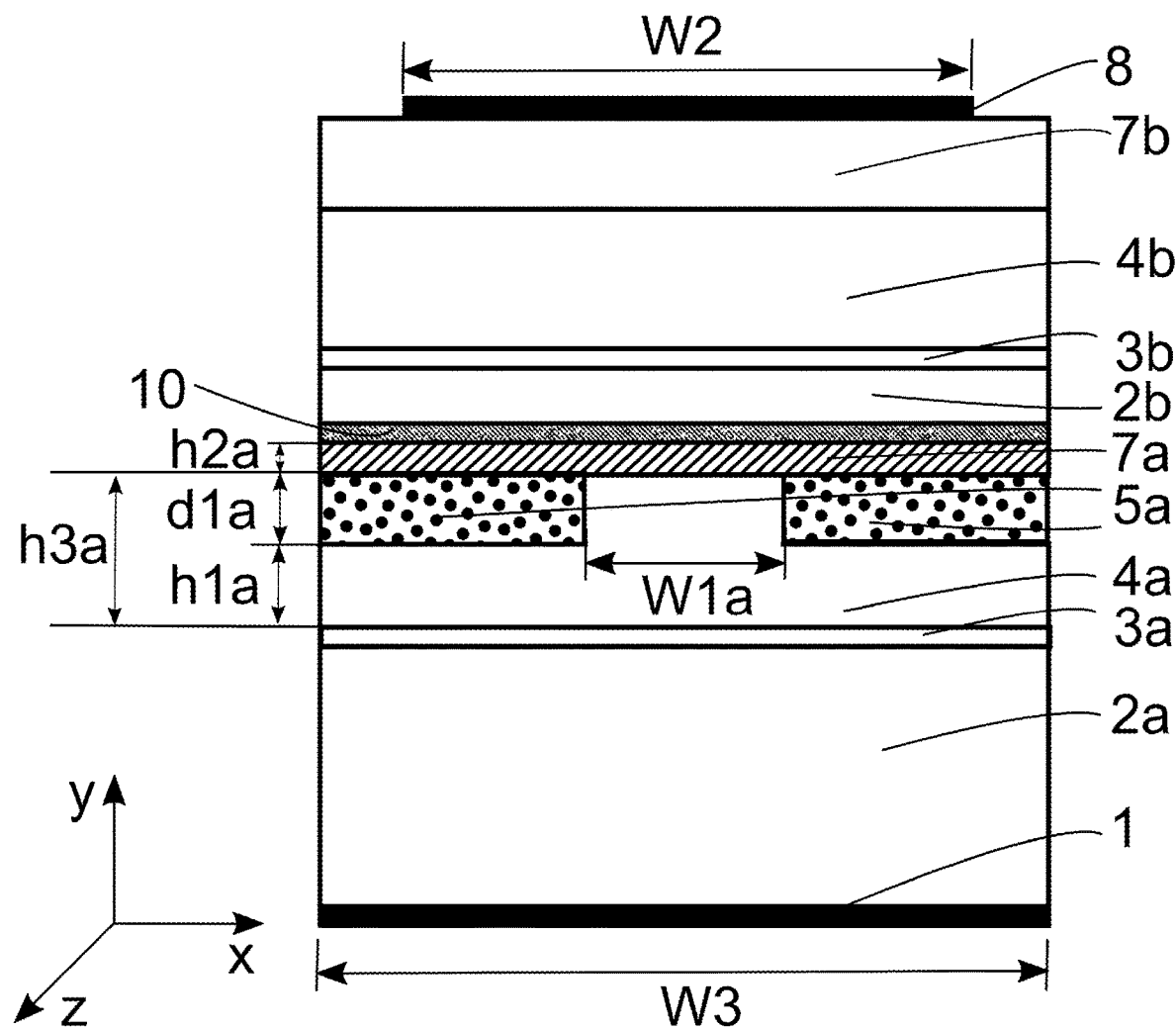
FIG. 3B shows yet another laser diode according to the invention in a schematic sectional representation.

FIG. 3B shows a further embodiment of a laser diode according to the invention in a schematic sectional representation. In this embodiment of a laser diode having two stacked emitters a, b along the second axis Y, the expansion of the current is only prevented by a current barrier 5a for the lowest emitter. The advantage of this embodiment with respect to that of FIG. 3A is the simpler production since only one current barrier has to be formed.

Figure 4:
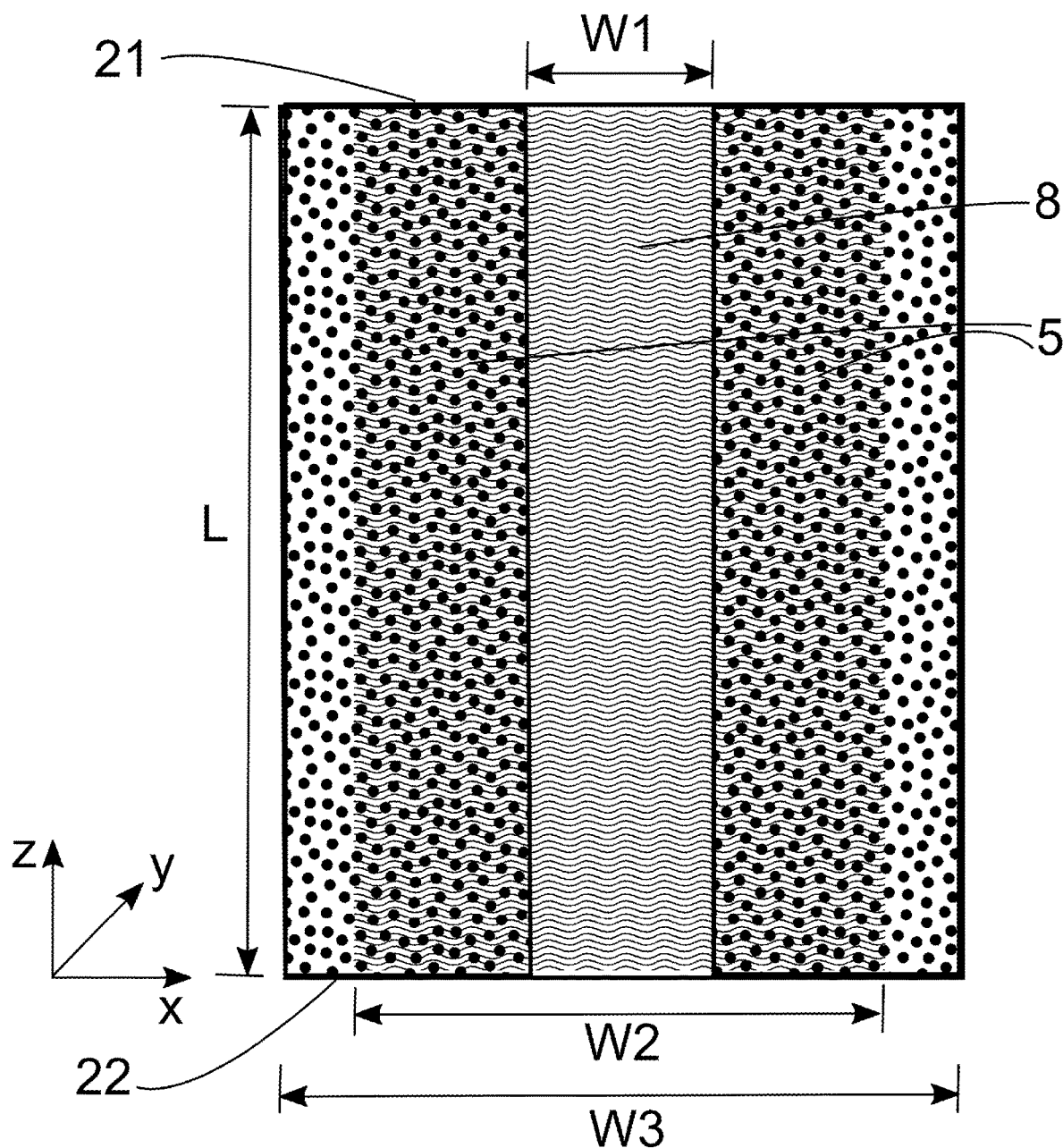
FIG. 4 shows the laser diode according to the invention from FIG. 1 in a schematic representation in a top view.

FIG. 4 shows the laser diode according to the invention from FIG. 1 in a schematic representation in a top view. The metal p-contact 8 is depicted in a transparent manner as a wave pattern, so as not to conceal the underlying opening of the current barrier 5. In this embodiment, the current barrier 5 has an opening. The width W1 of the opening extends in an unchanged manner in the direction of the first axis Z.

Figure 5:
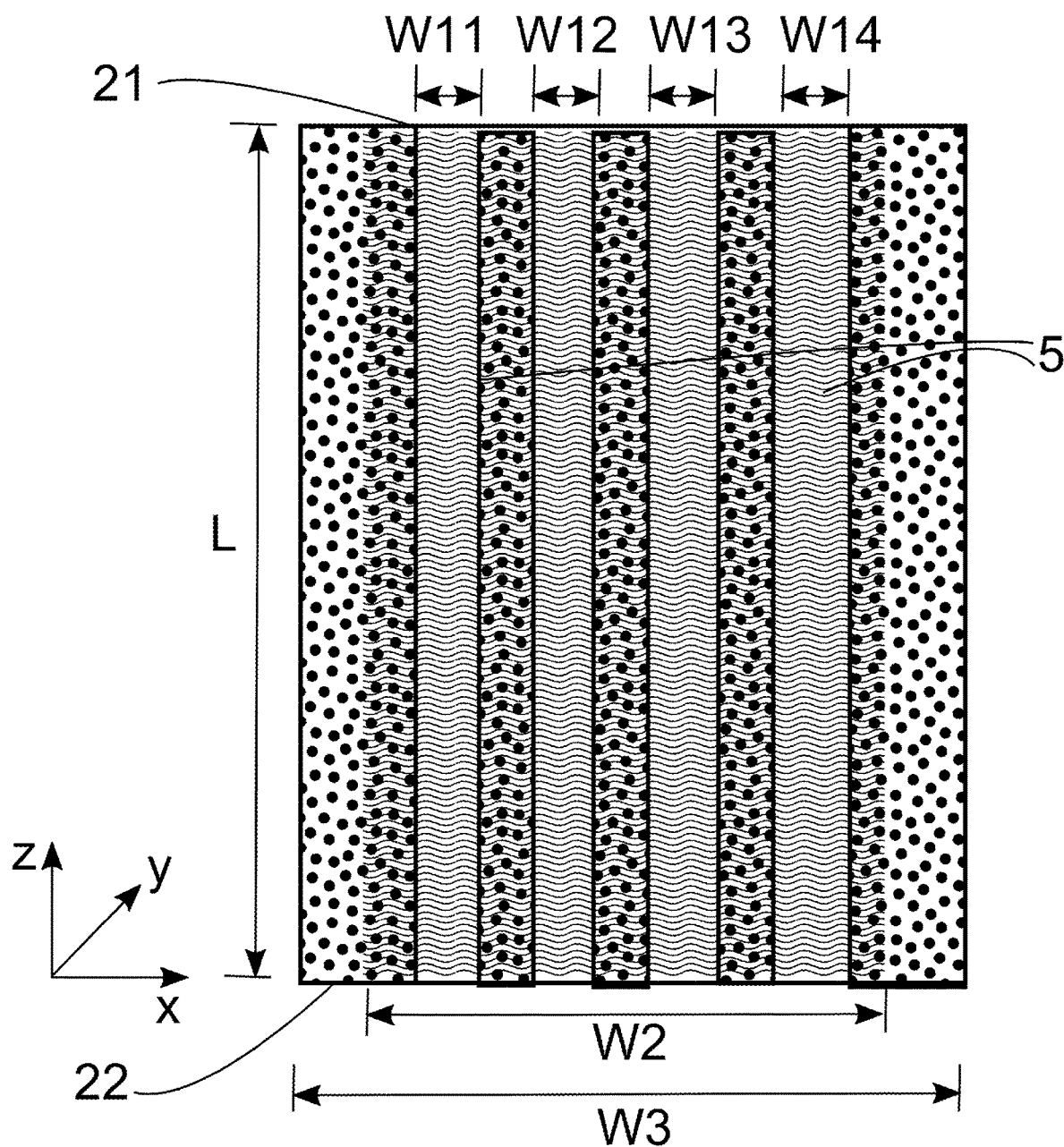
FIG. 5 shows the laser diode according to the invention from FIG. 2 in a schematic representation in a top view.

FIG. 5 shows the laser diode according to the invention from FIG. 2 in a schematic representation in a top view. In this embodiment, the current barrier 5 has four openings having widths W11, W12, W13 and W14. The widths W11, W12, W13, W14 of the openings remain constant in the direction of the first axis Z. In a preferred embodiment, the widths W11, W12, W13 and W14 of the openings of the current shield are the same size, as a result of which a particularly homogeneous power distribution along the second axis Y is achieved.

Figure 6:
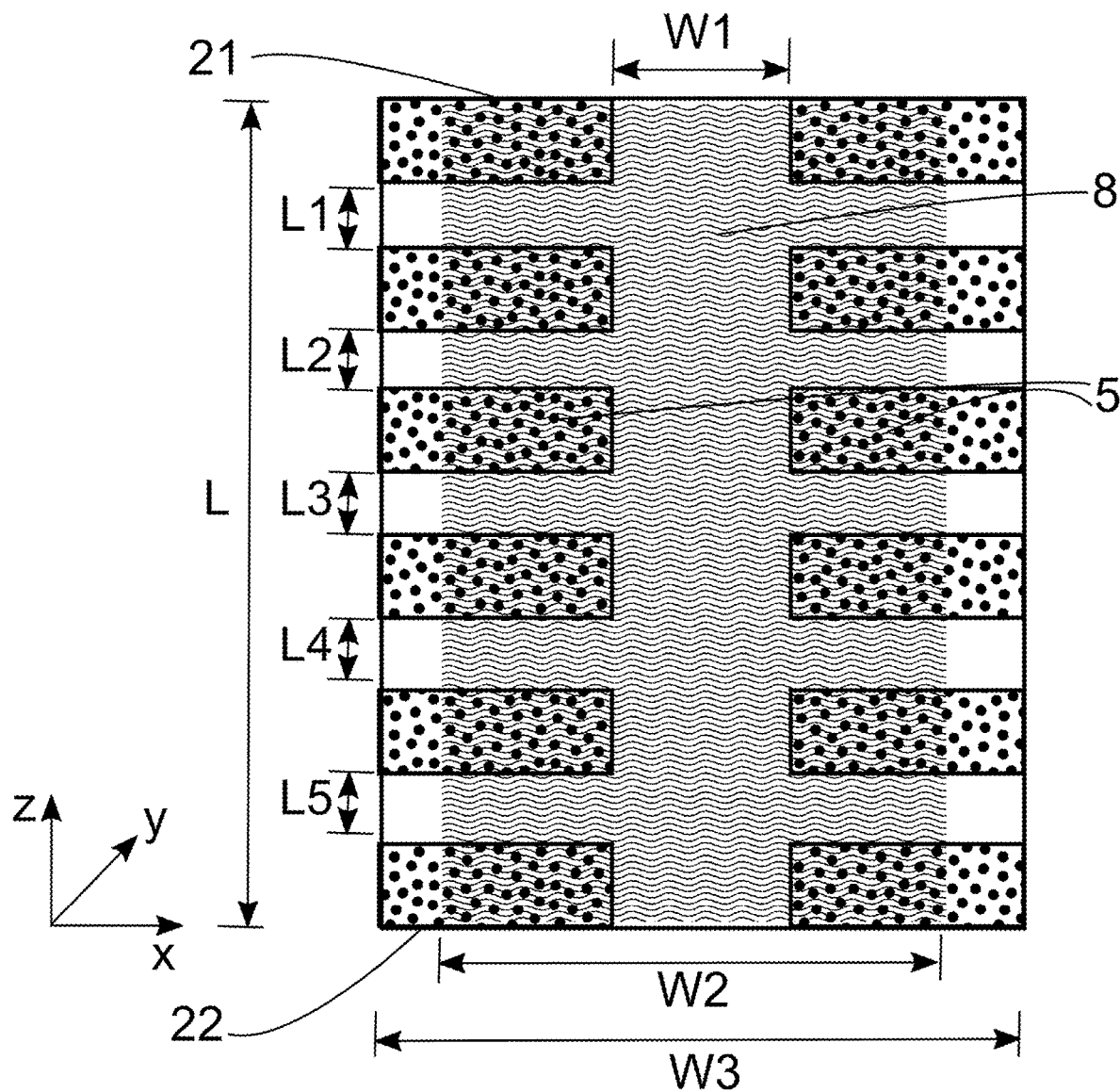
FIG. 6 shows a variant of the laser diode according to the invention from FIG. 1 in a schematic representation in a top view.

FIG. 6 shows a further embodiment of the laser diode according to the invention from FIG. 1 in a schematic representation in a top view. In this embodiment, six current barriers 5 are at a distance from one another with distances L1, L2, L3, L4 and L5 along the first axis Z. Each of the current barriers has an opening with the same width W1 and in the same position relative to the third axis X. In a preferred embodiment, the distances of the current barriers 5 are equidistant, i.e., the distances L1, L2, L3, L4 and L5 are the same size. As a result, a periodic modulation of the current density and, consequently, of the injected charge carriers in the active layer along the first axis Z is achieved, as a result of which the optical laser beam field is likewise periodically modulated. This can suppress the filamentation in broad-stripe lasers and, consequently, improve the beam quality.

Figure 7:
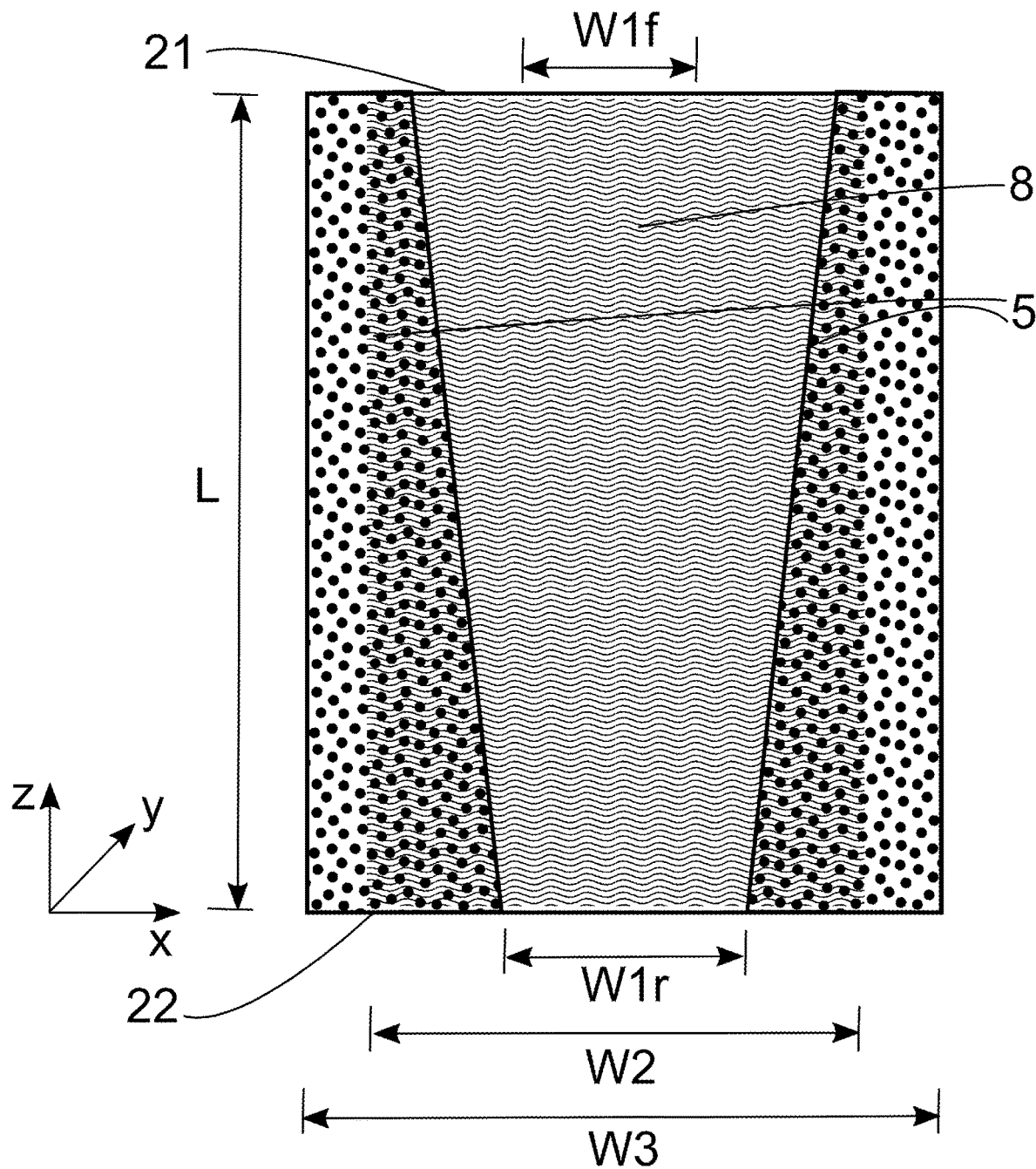
FIG. 7 shows a further variant of the laser diode according to the invention from FIG. 1 in a schematic representation in a top view.

FIG. 7 shows a further embodiment of the laser diode according to the invention from FIG. 1 in a schematic representation in a top view. In this embodiment, there is a current barrier 5 with an opening. The opening varies in its width (from W1r to W1f) in the direction of the third axis X along the first axis Z. This can be used to vary the optical power density along the first axis Z.

Figure 8:
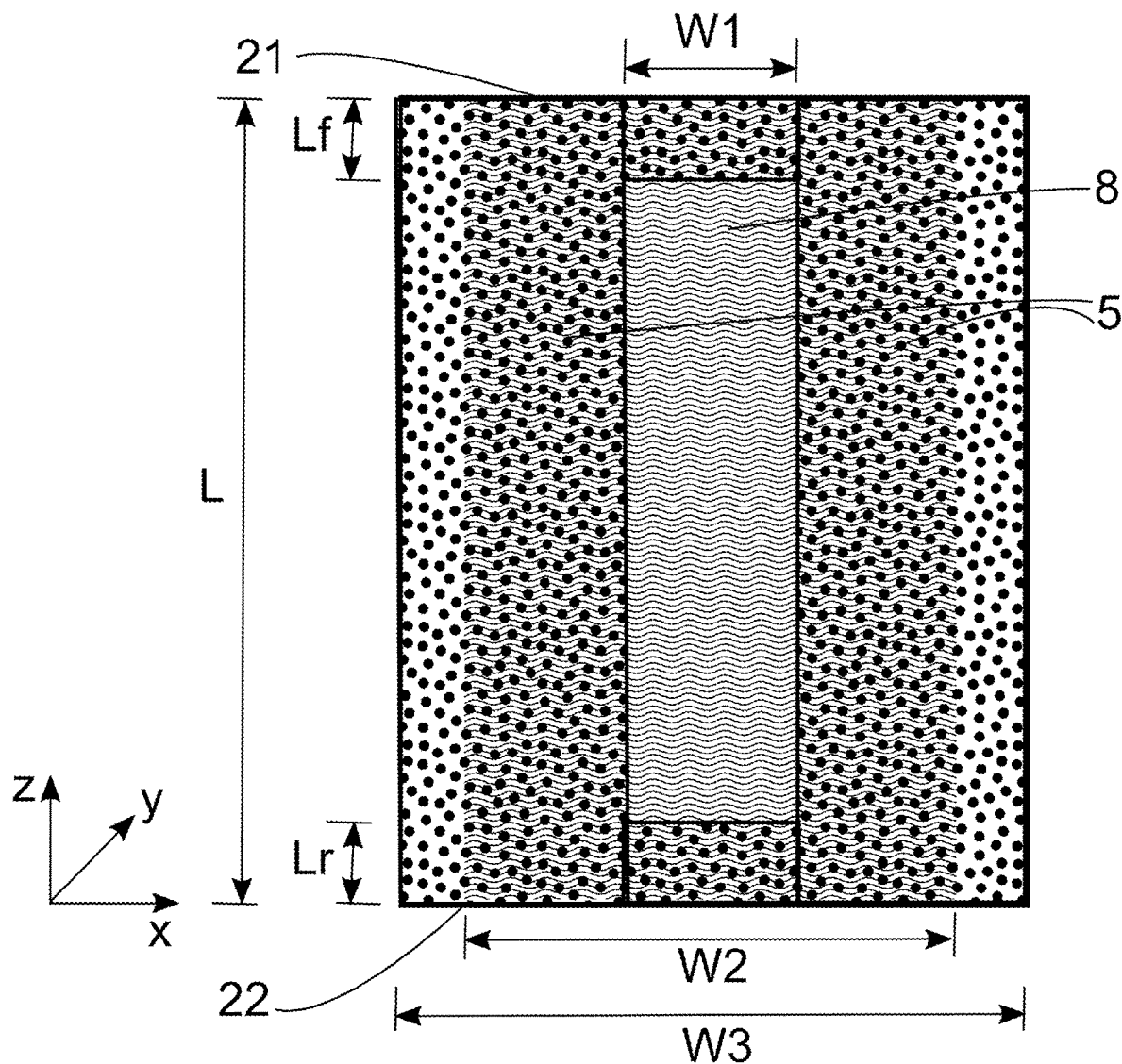
FIG. 8 shows yet another variant of the laser diode according to the invention from FIG. 1 in a schematic representation in a top view.

FIG. 8 shows a further embodiment of the laser diode according to the invention from FIG. 1 in a schematic representation in a top view. In this embodiment, the current barriers also extend with an expansion along the first axis Z of Lf and Lr along a region of the facets 21, 22. This can reduce the service life of the laser.

LIST OF REFERENCE NUMERALS

1 Metal n-contact
2 First n-type functional layers including n-type carrier substrate
3 Active layer
4 First p-type functional layers
5 Current barrier
6 Boundary surface between the first p-type functional layers and the second p-type functional layers
7 Second p-type functional layers
8 Metal p-contact
X Third axis
Y Second axis
Z First axis
h1 Distance of the current barrier from the active layer (thickness of a non-implanted part of the first p-type layers)
d1 Thickness of the current barrier
h2 Thickness of the second p-type layers
h3 Thickness of the first p-type layers
W1 First width of the opening of the current barrier
W2 Second width of the metal p-contact
W3 Third width of the metal n-contact
W11-W14 Width of openings in a current barrier
W1a Width of the opening of a first current barrier
W1b Width of the opening of a second current barrier
W1r Width of the opening of a current barrier on a first facet
W1f Width of the opening of a current barrier on a second facet
L Distance of the facets (length of the resonator)
L1-L5 Distances of the current barriers
10 Tunnel diode
21 First facet
22 Second facet
2a-7a Layers of the first laser
2b-7b Layers of the second laser

The invention claimed is:

1. A diode laser having a layer structure, the layer structure comprising:
   first n-type functional layers;
   a metal n-contact;
   an active layer which is configured for generating electromagnetic radiation and which is arranged on the first functional layers;
   second p-type functional layers which are arranged on the active layer, wherein the second functional layers comprise first p-type layers and second p-type layers, wherein the first p-type layers comprise a p-type waveguide layer and a p-type cladding layer, and the second p-type layers comprise a p-type contact layer;
   a metal p-contact;
   a current barrier which is introduced between the first p-type layers and the second p-type layers; and
   at least one facet for coupling out electromagnetic radiation along a first axis, wherein the first functional layers, the active layer and the second functional layers are stacked along a second axis, wherein the current barrier extends along a third axis, wherein the current barrier has at least one opening, and wherein a first width of the opening of the current barrier along the third axis is smaller than a second width of the metal p-contact along the third axis, and a projection of the first width onto the metal p-contact lies within the second width;

wherein the current barrier is formed by the introduction of impurity atoms into the first p-type layers by implantation or diffusion;

wherein a specific electrical resistance of the current barrier is more than double the amount of a specific electrical resistance of the layer structure, and wherein the thickness of the first p-type layers is less than 2 µm and the thickness of the second p-type layers is greater than 0.5 µm.

2. The diode laser of claim 1, wherein the current barrier is only introduced into partial regions of the first p-type layers.

3. The diode laser of claim 1, wherein the first n-type functional layers consist of precisely one n-cladding layer, one n-waveguide layer and one n-contact layer.

4. The diode laser of claim 1, wherein the first p-type layers consist of precisely one p-waveguide layer and one p-cladding layer.

5. The diode laser of claim 1, wherein the second p-type layers consist of precisely one p-contact layer.

6. The diode laser of claim 1, wherein the first p-type layers and the second p-type layers consist of different materials.

7. The diode laser of claim 1, wherein a thickness of the first p-type layers is smaller than a thickness of the second p-type layers.

8. The diode laser of claim 1, wherein the current barrier has a plurality of openings, wherein a projection of the openings along the second axis completely overlaps with the metal p-contact.

9. The diode laser of claim 1, wherein at least two active layers are formed at a distance from one another along the second axis, and wherein at least two current barriers are provided, which are formed at a distance from one another along the second axis.

10. The diode laser of claim 1, wherein at least two active layers are formed at a distance from one another along the second axis, and wherein only one current barrier is provided.

11. The diode laser of claim 1, wherein at least two current barriers are provided, which are formed at a distance from one another along the first axis.

12. The diode laser of claim 1, wherein the width of the opening of the current barrier varies along the first axis.

13. A method for producing a diode laser having a layer structure, comprising the following method steps:

forming first n-type functional layers;

forming an active layer which is configured for generating electromagnetic radiation and which is arranged on the first functional layers;

forming first p-type layers on the active layer, wherein the first p-type layers comprise a p-type waveguide layer and a p-type cladding layer, wherein the thickness of the first p-type layers is less than 2 µm;

introducing impurity atoms into the first p-type layers by implantation or diffusion in order to form a current barrier;

subsequently forming second p-type layers on the first p-type layers, wherein the second p-type layers comprise a p-type contact layer, wherein the thickness of the second p-conductive layers is greater than 0.5 µm;

forming a metal n-contact under the first n-type functional layers and configuring a metal p-contact on the second p-type layers, wherein a first width of a partial region of the first p-type layers, in which no impurity atoms are introduced, is smaller than a second width of the metal p-contact, and a projection of the first width onto the metal p-contact lies within the second width; and wherein the current barrier is formed such that a specific electrical resistance of the current barrier is more than double the amount of a specific electrical resistance of the layer structure.

14. The method of claim 13, wherein the impurity atoms for forming the current barrier are only introduced into partial regions of the first p-type layers.

15. The method of claim 13, wherein the impurity atoms are introduced by means of a structured mask.

16. The method of claim 15, wherein the mask is formed on the first p-type layers prior to the introduction of the impurity atoms and is removed again following the introduction of the impurity atoms into the first p-type layers.

17. The method of claim 13, wherein silicon, oxygen, iron or selenium are introduced into the first p-type layers as impurity atoms.

18. The method of claim 13, wherein the first n-type functional layers, the active layer, the first p-type layers and the second p-type layers are formed by epitaxial processes.

19. The method of claim 13, wherein a thickness of the first p-type layers is formed to be smaller than a thickness of the second p-type layers.

* * * * *